(12) United States Patent
Fujisawa et al.

(10) Patent No.: US 9,013,572 B2
(45) Date of Patent: Apr. 21, 2015

(54) METHOD FOR OBSERVING SAMPLE AND ELECTRONIC MICROSCOPE

(75) Inventors: Akiko Fujisawa, Hitachinaka (JP); Hiroyuki Kobayashi, Mito (JP); Eiko Nakazawa, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1028 days.

(21) Appl. No.: 13/126,638

(22) PCT Filed: Oct. 19, 2009

(86) PCT No.: PCT/JP2009/005430
§ 371 (c)(1),
(2), (4) Date: Apr. 28, 2011

(87) PCT Pub. No.: WO2010/050136
PCT Pub. Date: May 6, 2010

(65) Prior Publication Data
US 2011/0205353 A1 Aug. 25, 2011

(30) Foreign Application Priority Data
Oct. 31, 2008 (JP) ................................. 2008-280676

(51) Int. Cl.
*G06K 9/00* (2006.01)
*H04N 7/18* (2006.01)
(Continued)

(52) U.S. Cl.
CPC ............... *H01J 37/28* (2013.01); *H01J 37/222* (2013.01); *H01J 2237/221* (2013.01); *H01J 2237/226* (2013.01)

(58) Field of Classification Search
USPC .................... 348/80, E07.085; 382/128, 154; 250/307, 310–311, 358.1, 359.1, 361, 250/396, 442.11
See application file for complete search history.

(56) References Cited

U.S. PATENT DOCUMENTS 4,788,425 A * 11/1988 Kobayashi .................... 250/311
5,523,567 A * 6/1996 Kawamata et al. ........... 250/310
(Continued)

FOREIGN PATENT DOCUMENTS

JP 53-046266 4/1978
JP 61-126750 6/1986
(Continued)

OTHER PUBLICATIONS

Lombardo et al. (1999). Degradation and hard breakdown transient of thin gate oxides in metal-$SiO_2$-Si capacitors: Dependence on oxide thickness. *J Appl Phys*, 86(11), 6382-6391.
(Continued)

*Primary Examiner* — Christopher S Kelley
*Assistant Examiner* — Maria Vazquez Colon
(74) *Attorney, Agent, or Firm* — McDermott Will & Emery LLP

(57) ABSTRACT

A sample observation method of the present invention comprises a step of defining, with respect to an electron microscope image, an outline of an observation object with respect to a sample (3), or a plurality of points located along the outline, and a step of arranging a plurality of fields of view for an electron microscope along the outline, wherein electron microscope images of the plurality of fields of view that have been defined and arranged along the shape of the observation object through each of the above-mentioned steps are acquired. It is thus made possible to provide a sample observation method that is capable of selectively acquiring, with respect to observation objects of various shapes, an electron microscope image based on a field of view definition that is in accordance with the shape of the observation object, as well as an electron microscope apparatus that realizes such a sample observation method.

13 Claims, 14 Drawing Sheets

(51) Int. Cl.
  *H01J 37/28* (2006.01)
  *H01J 37/22* (2006.01)

(56) References Cited

U.S. PATENT DOCUMENTS

| | | | |
|---|---|---|---|
| 7,102,145 | B2* | 9/2006 | Domenicucci et al. .... 250/492.1 |
| 7,224,437 | B2* | 5/2007 | Percin et al. .................... 355/55 |
| 7,253,645 | B2* | 8/2007 | Talbot et al. ............. 324/754.22 |
| 7,732,792 | B2* | 6/2010 | Matsuoka et al. ....... 250/492.22 |
| 2002/0024012 | A1* | 2/2002 | Abe et al. ...................... 250/311 |
| 2003/0173516 | A1 | 9/2003 | Takane et al. |
| 2005/0121610 | A1 | 6/2005 | Abe |
| 2008/0283750 | A1 | 11/2008 | Nakazawa et al. |

FOREIGN PATENT DOCUMENTS

| | | |
|---|---|---|
| JP | 63-4056 | 1/1988 |
| JP | 01-097359 | 4/1989 |
| JP | 04-184849 | 7/1992 |
| JP | 7-130319 | 5/1995 |
| JP | 2005-116795 | 4/2005 |
| JP | 2008-282775 | 11/2008 |

OTHER PUBLICATIONS

Patsis et at. (2003). Quantification of line-edge roughness of photoresists. I. A comparison between off-line and on-line analysis of top-down scanning electron microscopy images. *J Vac Sci Technol B*, 21(3), 1008-1018.

Shu et al. (1988). A line extraction method for automated SEM inspection of VLSI resist. *IEEE T Pattern Anal*, 10(1), 117-120.

Wong et at. (2009). Crack coalescence in molded gypsum and carrara marble: Part 2—microscopic observations and interpretation. *Rock Mech Rock Eng*, 42(3), 513-545.

Extended European Search Report issued in European Patent Application No. 09823250.7, dated Mar. 30, 2012.

Patsis et al. (2003). Quantification of line-edge roughness of photoresists. I. A comparison between off-line and on-line analysis of top-down scanning electron microscopy images. *J Vac Sci Technol B*, 21(3), 1008-1018.

Wong et al. (2009). Crack coalescence in molded gypsum and carrara marble: Part 2-microscopic observations and interpretation. *Rock Mech Rock En*, 42(3), 513-545.

* cited by examiner

Given field of view

Specify plurality of points of boundary

Display consecutive field of view image imaging regions a — Pre-registered pattern b — Given field of view c — Display extracted pattern and consecutive field of view image imaging regions Grid display Specifying of imaging regions

METHOD FOR OBSERVING SAMPLE AND ELECTRONIC MICROSCOPE

TECHNICAL FIELD

RELATED APPLICATIONS

This application is the U.S. National Phase under 35 U.S.C. § 371 of International Application No. PCT/JP2009/005430, filed on Oct. 19, 2009, which in turn claims the benefit of Japanese Application No. 2008-280676, filed on Oct. 31, 2008, the disclosures of which Applications are incorporated by reference herein.

The present invention relates to an imaging method for electron microscopes, and more particularly to an electron microscope that images consecutive fields of view a plurality of times and combines the respective fields of view in order to record a wide region with favorable resolution.

BACKGROUND ART

With respect to electron microscopes, there is a method in which, in order to record a wide region with favorable resolution, consecutive field of view imaging (combined photography) is performed, where consecutive fields of view are imaged a plurality of times at a high magnification that results in the desired resolution and the respective fields of view are combined to form a single image. A method for performing such consecutive field of view imaging is disclosed in Patent Document 1

There is presented in Patent Document 1 a method of performing an imaging process automatically in synchrony with the field of view movement (stage movement) by specifying in advance the imaging magnification, how many times imaging is performed (the number of images produced in the vertical and horizontal directions), and the overlap amount between adjacent fields of view.

In addition, there is described in Patent Document 2 a method of performing an imaging process automatically in synchrony with the field of view movement (stage movement) while also automatically calculating how many times imaging is to be performed by specifying the coordinates of the vertices of the region of the consecutive fields of view to be imaged as a whole. In addition, in Patent Document 1, there is also presented a function for displaying a field of view region to be consecutively imaged.

PRIOR ART DOCUMENTS

Patent Documents

Patent Document 1: JP Patent Publication (Kokai) No. 61-126750 A (1986)
Patent Document 2: JP Patent Publication (Kokai) No. 4-184849 A (1992)

SUMMARY OF THE INVENTION

Problems to be Solved by the Invention

In both Patent Document 1 and Patent Document 2, there are described examples in which a plurality of imaging fields of view are defined in such a manner that the interior of a rectangle, or of a region formed by a combination of rectangular shapes, containing an object to be observed is swept, and parts between the respective fields of view are placed over one another. However, with such methods, because the interior of the above-mentioned region is imaged without any parts being left out, imaging fields of view would be defined even with respect to regions which actually need not be included, resulting in poor efficiency.

A sample observation method and an electron microscope are described below, an object thereof being to selectively assign observation fields of view with respect to parts of a sample to be observed that are necessary for observation.

Means for Solving the Problems

In order to achieve the object above, there are proposed below a sample observation method comprising: a step of defining an outline, or a plurality of points located along the outline, with respect to an electron microscope image; and a step of arranging a plurality of fields of view of the electron microscope along the outline. There is also proposed an apparatus for realizing this method.

By arranging fields of view after having defined necessary outlines with respect to objects to be observed that have various shapes, it becomes possible to selectively acquire electron microscope images based on necessary field of view definitions that conform to the shapes of the objects being observed.

Effects of the Invention

According to the configuration above, it becomes possible to arrange a plurality of fields of view in an appropriate manner regardless of the shape of the object being observed. Consequently, it becomes possible to efficiently acquire necessary field of view images.

MODES FOR CARRYING OUT THE INVENTION

Figure 1:
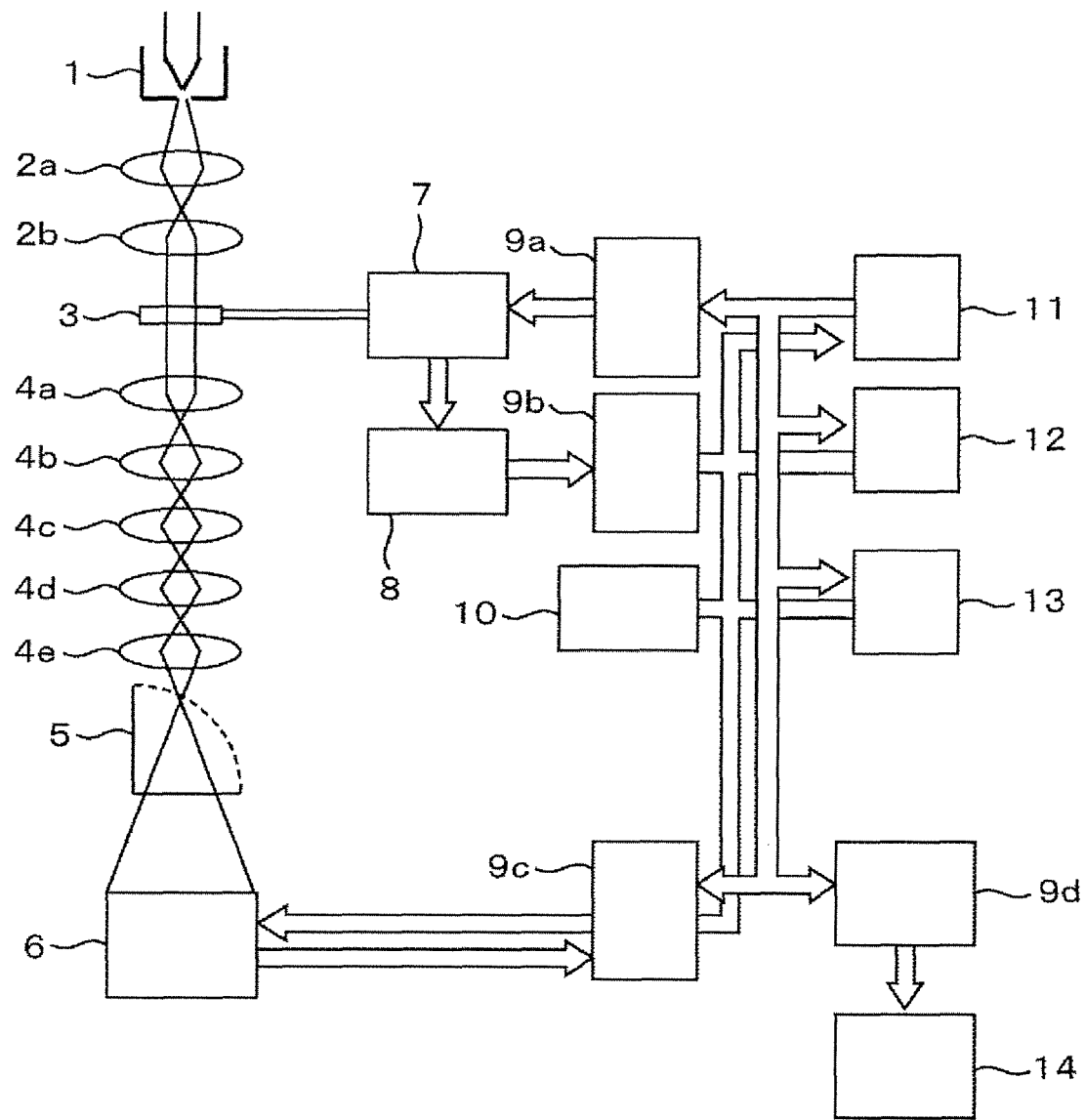
FIG. 1 is a diagram illustrating one example of the configuration of a transmission electron microscope.

A method for defining a field of view of a high-magnification image (second image) with respect to a low-magnification image (first image), as well as a transmission electron microscope (TEM) for realizing it, and a computer program for executing the method above are described below.

When fields of view (FOVs) are consecutively arranged in the vertical direction and the horizontal direction with respect to a low-magnification image, the set of the thus arranged FOVs takes on a square or rectangular block shape. By way of example, if the object being observed is elongate and lies obliquely, or if the consecutive fields of view of interest are connected in a curved manner, and so forth, unnecessary fields of view would be imaged, which is inefficient. In other words, where imaging was performed using time for performing unnecessary imaging processes as well as films, CCD devices, etc., for recording unnecessary imaging results, ample memory capacity for image data had to be secured. In addition, there was no function for displaying what sort of fields of view the consecutive field of view regions are being imaged by, and viewing in advance was not possible. Further, it was not possible to view the progress of repeated imaging processes.

Because of the rectangular shape of the imaging region, in imaging consecutive fields of view, field of view movements were carried out in such a manner that there would be a predetermined overlap amount in the vertical and horizontal directions of the imaging region. Specifically, the directions of the field of view movements were in alignment with the vertical and horizontal directions of the imaging region. In other words, because the fields of view were consecutively arranged vertically and horizontally, fields of view were consequently disposed even at unnecessary parts, which was inefficient.

In the present embodiments, by defining an outline, or a plurality of points along the outline, with respect to a low-magnification image, it becomes possible to arrange in an appropriate manner fields of view of a high-magnification image where needed. Further, as for the directions of the field of view movements thereof, even if a method based on sample stage control or a method in which field of view movements are performed by electromagnetically deflecting the electron beam were to be adopted, since movement is possible in any desired direction, it is possible to image consecutive fields of view while securing a predetermined overlap amount between fields of view that are adjacent in any desired direction by providing a means with which a field of view movement direction can be specified for each field of view.

The means capable of specifying field of view movement directions may be made possible by providing an input means which displays all field of view regions of interest and with which a plurality of, or consecutive, field of view positions can be specified in such a manner that each region necessary for imaging would be included. Further, by providing a means that displays each imaging region superimposed on the aforementioned display, and adopting such display control that the display is made to differ every time the imaging of each region is completed, it is possible to view each imaging field of view and to visualize the progress of the imaging process.

With the configuration above, it is possible to vary the field of view movement direction in accordance with the shape of the object being observed. Consequently, it is possible to consecutively image the respective fields of view in an efficient manner. Specifically, it is possible to cut the time for performing unnecessary imaging processes, to eliminate film for recording unnecessary imaging results, and if imaging is performed using CCD devices, etc., it becomes no longer necessary to needlessly secure memory capacity for image data. As a result, the cumbersome task of combining image data becomes efficient with only minimal data In addition, visualizing and allowing the viewing of the number of times consecutive field of view imaging processes are performed, the respective imaging field of view positions, and the progress status result in improved operability.

Embodiment 1

FIG. 1 is one embodiment showing the configuration of an electron microscope.

Although the description below relates to TEMs, it is also applicable to other electron microscopes (scanning electron microscopes (SEMs), scanning transmission electron microscopes (SEMs)).

In FIG. 1, the electron beam emitted from an electron gun 1 is focused by irradiation lenses 2 and irradiates a sample 3 held on a sample stage. The electron beam transmitted by the sample 3 is magnified by an image forming lens system 4, and an image is formed on a fluorescent plate 5, or on a scintillator within an imaging apparatus 6. The magnified image formed on the scintillator is imaged with an imaging device, such as a CCD, etc., via an optical lens or a fiber plate that is within the imaging apparatus, and is converted into electrical signals (image signals). These image signals are read by a PC 11 via an interface 9c and are displayed on a monitor 14 as an image. In so doing, the image signals outputted via the interface 9c may also be stored by the PC 11 as image data in a memory 12. It is noted that in the description below, the controlling entity of the TEM may sometimes be referred to simply as a "control unit."

The memory 12, a processing unit 13, an input device 10, such as a keyboard or a mouse, to be used in specifying conditions, etc., and a monitor 14 are connected to the PC 11. In addition, a sample stage drive part 7 for holding and moving the sample 3 is controlled by the PC 11 via an interface 9a part. Further, the PC 11 also controls the electron gun 1, the irradiation lenses 2, the image forming lens system 4, etc.

With respect to the configuration above, a specific embodiment is described below.

In imaging a sample, an observation magnification M that allows for the viewing of the entire region of interest of the sample 3 is set, and the sample stage drive part 7 is moved in such a manner that desired field of view regions would fall within the imaging range. In so doing, the coordinate position of the sample stage drive part 7 is read in synchrony with the sample stage drive part 7 by a stage position detector 8 connected to the sample stage drive part 7, and is transmitted to the PC 11 via an interface 9b. Besides position information of the sample stage, there are stored on the PC 11 parameters for controlling the drive conditions for the sample stage, such as the movement amount of the sample stage, overlap amount between adjacent fields of view, number of consecutive field of view images imaged, specification of imaging range, etc.

Figure 2:
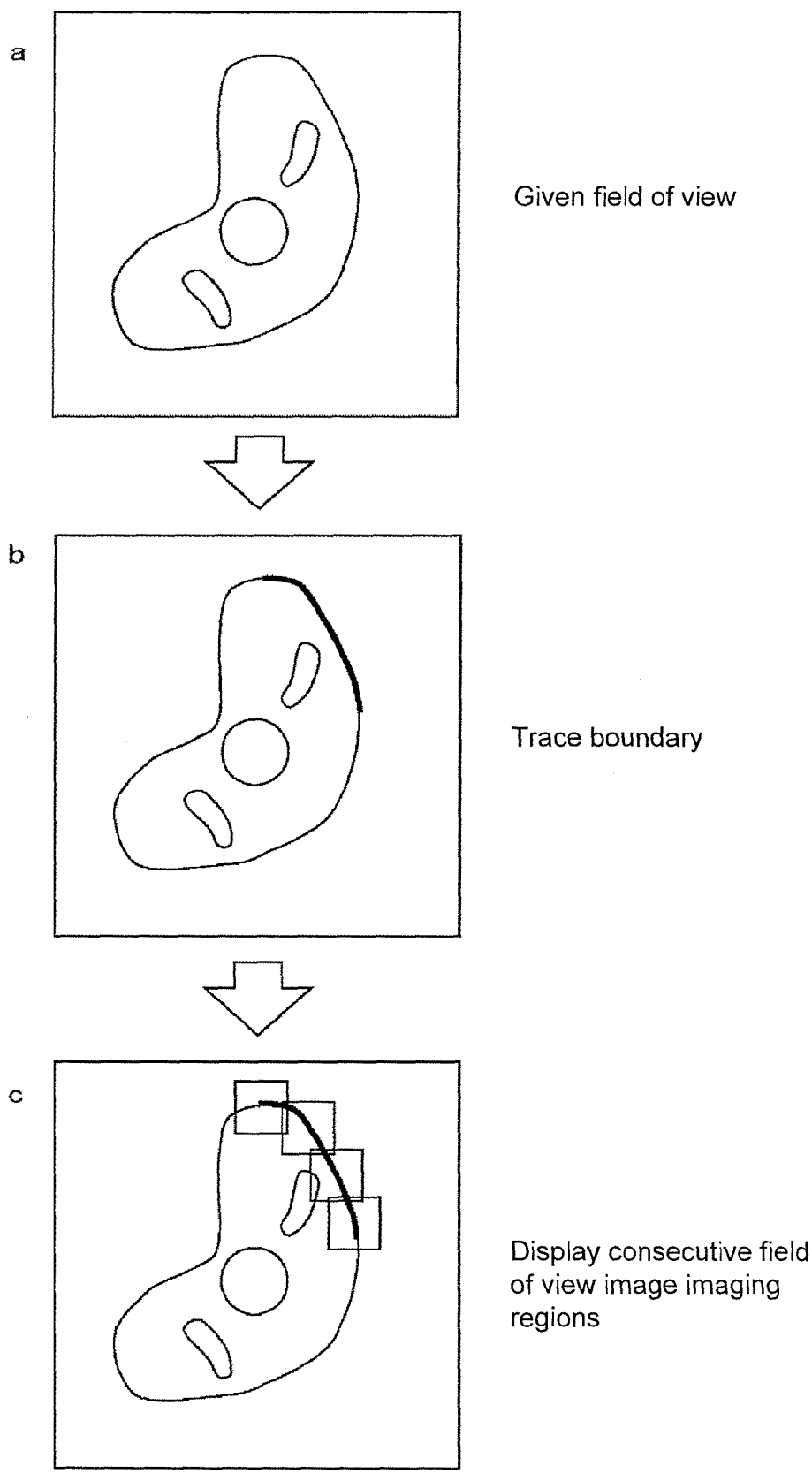
FIG. 2 is a diagram illustrating a method of defining consecutive field of view imaging regions by tracing a boundary of an object to be observed.
Figure 3:
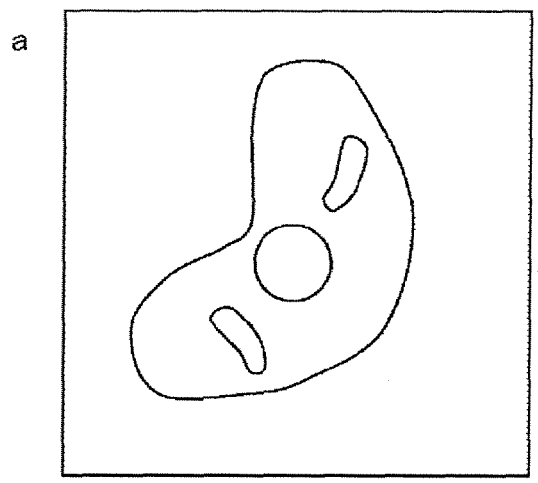
FIG. 3 is a diagram illustrating a method of defining consecutive field of view imaging regions by specifying a plurality of desired positions along a boundary of an object to be observed.
Figure 3:
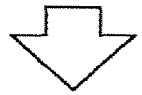
Figure 3:
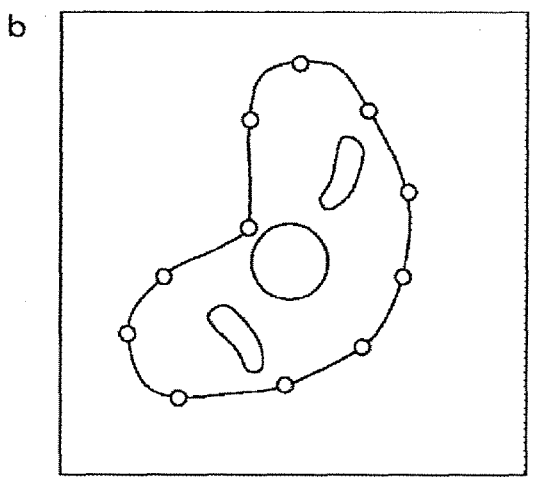
Figure 3:
Figure 3:
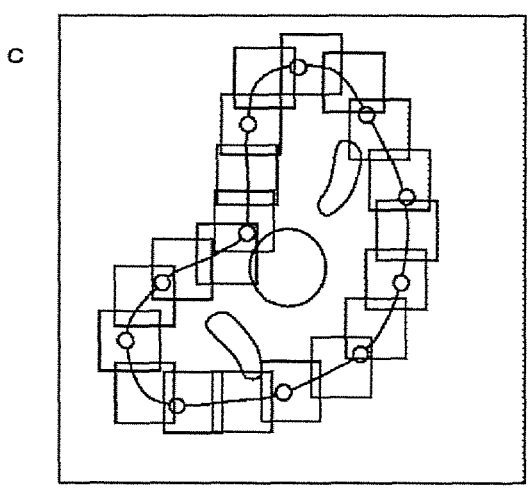

With respect to a transmission electron microscope of the configuration shown in FIG. 1, a method is described with reference to the flowchart in FIG. 4, where imaging is performed by determining consecutive field of view regions through a method in which, as shown in FIG. 2, an image in which the entire region of interest can be viewed is displayed on a monitor, and a boundary (outline) of the object being observed is traced with a cursor using the displayed image, or through a method in which, as shown in FIG. 3, a plurality of desired positions along the boundary of the object being observed are specified, and an interpolation computation is performed between the specified positions, and by controlling the stage, or the electron beam deflector, in such a manner that only the boundary of the region, or the region as a whole, would form consecutive fields of view at a predetermined magnification and overlap amount.

In the present embodiment, by way of example, it is assumed that a given field of view is acquired as shown in FIG. 2a, where the entire region of interest can be viewed on the monitor 14. When the boundary line of a given object being observed is traced as shown in FIG. 2b, consecutive field of view imaging regions such as those shown in FIG. 2c are outputted to the monitor 14, and consecutive field of view images of the boundary alone, or of the entire region, are imaged. Similarly, it is assumed that a given field of view in which the entire region of interest can be viewed on the monitor 14 is obtained as in FIG. 3a. When a plurality of desired positions along the boundary line of the object being observed are specified as shown in FIG. 3b, consecutive field of view imaging regions are outputted on the monitor 14 as shown in FIG. 3c, and consecutive field of view images of the boundary alone, or of the entire region, are imaged.

In step 101, consecutive field of view imaging conditions are defined. The operator inputs imaging magnification M' of any desired value for the consecutive field of view images and overlap amount ΔN pixels for the field of view. The operation here is performed using the input device 10, such as a keyboard and a mouse, etc. Next, in step 102, magnification M of any desired value with which the entire region of interest can be viewed is defined, and a boundary (outline) of the object being observed is traced using the input device 10, such as a keyboard or a mouse, etc., while looking at the image of the sample 3 displayed on the monitor 14. Alternatively, a plurality of desired positions along the boundary line of the object being observed are specified. In so doing, the traced or voluntarily specified coordinates are defined as $(x_1, y_1)$, $(x_2, y_2)$, $(x_3, y_3)$ ..., $(x_m, y_m)$ (where $x_j$, $y_j$ are integers, whose units with respect to the coordinate system of the image data are in pixels) and stored in the memory 12. In step 103, all regions of the imaging fields of view are outputted on the monitor 14. In step 104, the boundary of the region of interest is approximated, with the polynomial curve $y=f(x)$, from the plurality of points specified in step 102. However, if the boundary of the region of interest forms a closed curve, approximation may be carried out with curves divided plurally as desired, step 104 through step 115 may be repeated a number of times corresponding to how many divided curves there are, and the consecutive field of view images imaged may be combined and outputted as one image.

The least-squares method for approximating the plurality of specified points with a specific function, $y=f(x)$, in step 104 will now be described generally. The least-squares method refers to a method for determining a coefficient that minimizes the sum of the squares of residuals so that, in approximating pairs of measured numerical values using a specific function, the model function would result in favorable approximations with respect to the measured values. It is now assumed that there is a set of input coordinates, namely, $(x_0, y_0)$, $(x_1, y_1)$, $(x_2, y_2)$ ..., $(x_m, y_m)$ (where $x_j$, $y_j$ are integers, whose units with respect to the coordinate system of the image data are in pixels). The distribution of these $(x_j, y_j)$ is approximated with a polynomial curve of degree n as in Equation (1) below.
[Equation 1]

$$y=f(x)=\Sigma_{i=0}^{n}A_ix^i \qquad (1)$$

The calculated values for the respective $x_j$ would be $(x_0, f(x_0))$, $(x_1, f(x_1))$, $(x_2, f(x_2))$ ..., $(x_m, f(x_m))$, where the sum of the squares of the residuals from actually measured values $y_j$, may be given by,
[Equation 2]

$$\Delta=\Sigma_{j=0}^{m}(y_j-f(x_j))^2=\Sigma_{j=0}^{m}(y_j-\Sigma_{i=0}^{n}A_ix_j^i)^2 \qquad (2)$$

Thus, one need only find $A_i$ (where i=0, 1, 2, 3 ..., n) for which Δ is smallest. With Equation (2) regarded as being a function with variable $A_i$, the case in which Δ, partially differentiated with respect to each $A_i$, equals zero is the condition under which Δ becomes smallest. In other words, this may be expressed as $$\frac{\delta \Delta}{\delta Ai}=0$$
$$(i=0,1,2,3,\ldots,n)$$

Thus, the following conditional expression may be derived by substituting Equation (2),
[Equation 3]

$$\Sigma_{j=0}^{m}\Sigma_{i=0}^{n}A_ix_j^{k+i}=\Sigma_{j=0}^{m}y_jx_j^k \qquad (3)$$

Since Equation (3) gives simultaneous equations with n+1 unknowns, these are solved to derive $A_i$ and approximate equation $y=f(x)$ is found. While, with respect to the present embodiment, there has been described a method that uses the least-squares method, any method may be used for this curve interpolation method. In step 105, the minimum value and the maximum value for x with respect to the plurality of specified points $(x_1, y_1)$, $(x_2, y_2)$, $(x_3, y^3)$, ..., $(x_m, y_m)$ (where $x_j$, $y_j$ are integers, whose units with respect to the coordinate system of the image data are in pixels) are extracted and are respectively defined as $x_{min}$ and $x_{max}$. In step 106, the x-coordinate of the starting point for consecutive field of view imaging is defined as $x_s=x_{min}$. In step 107, from the approximate equation $y=f(x)$ found in step 104, the y-coordinate of the starting point for consecutive field of view imaging is given by $y_s=f(x_s)$. In addition, the end point of consecutive field of view imaging is set to the same x-coordinate as that of the next starting point $(x_e=x_s)$. In step 108, the stage drive part 7 moves to stage coordinates $(X, Y)$, which are calculated as follows, in order to perform consecutive field of view imaging. Here, as observation conditions for viewing, in step 102, the entire range across which consecutive field of view image imaging is to be performed, assuming that the stage coordinates are $(X_0, Y_0)$, that the imaging magnification is M, that the number of imaged pixels is N×N pixels, and that the imaging region (scintillator size) is L×L pixels, then stage coordinates $(X, Y)$ may be given by
[Equation 4]

$$X=(x_s-N/2)\times\delta_M+X_0,\ Y=(y_s-N/2)\times\delta_M+Y_0,\ \delta_M=(L/M)/N \qquad (4)$$

In step 109, the PC 11 performs imaging after changing to imaging magnification M' of any desired value for the consecutive field of view images as set in step 101. In step 110, $x_e=x_e+1$. In step 111, it is determined whether or not $x_e$ calculated in step 110 is greater than $x_{max}$. If it is greater, the process proceeds to step 116 and imaging is terminated. If it is less, the process proceeds to step 112. In step 112, it is determined whether or not $x_e$ is equal to $x_{max}$. If it is equal, the process returns to step 108, and consecutive field of view imaging is continued with $x_s = x_e$. If it is different, the process proceeds to step 113. In step 113, movement distance d for the stage is calculated.

[Equation 5]

$$d = \{(x_e - x_s)^2 + (f(x_e) - f(x_s))^2\}^{\frac{1}{2}} \quad (5)$$

In step 114, with respect to d as calculated in step 113,

[Equation 6]

$$d \leq (N - \Delta N)/(M'/M) \quad (6)$$

the determination above is made. If $d \leq (N-\Delta N)/(M'/M)$, the process proceeds to step 108. If $d > (N-\Delta N)/(M'/M)$, the process proceeds to step 107 with $x_s = x_e$. Operations are repeated until the entire imaging range inputted in step 102 has been imaged. In addition, as an alternative to the above-described method of imaging consecutive field of view images through stage control, it is also possible to perform imaging through a method in which an electron beam deflector is controlled.

Figure 4:
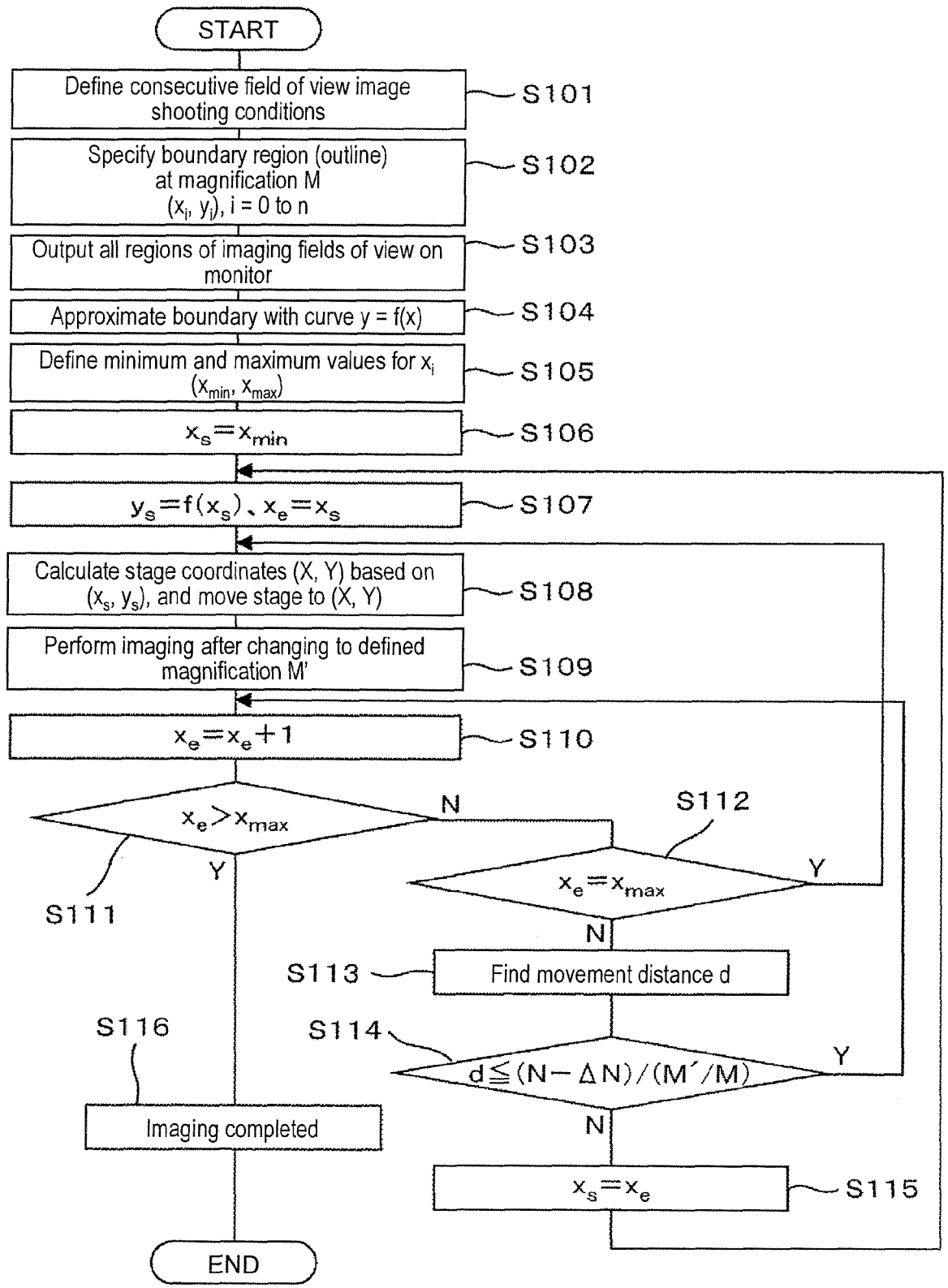
FIG. 4 is a flowchart illustrating an operation of consecutive field of view imaging.
Figure 5:
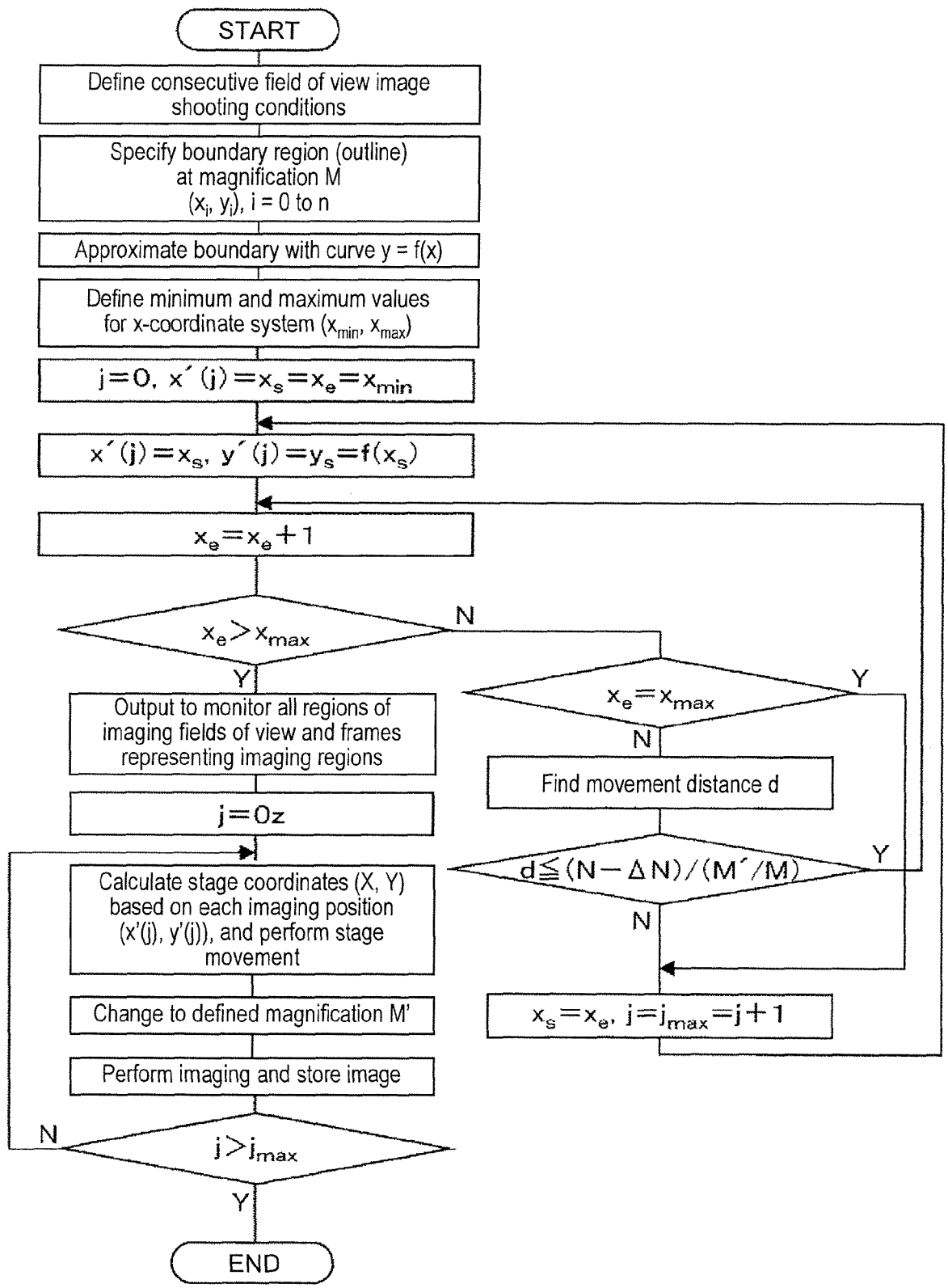
FIG. 5 is a flowchart illustrating an operation of consecutive field of view imaging.

In the flowchart in FIG. 4, the destination of the next field of view among the consecutive fields of view is calculated each time imaging is finished. Accordingly, it is not possible to view the imaging region of each field of view before the imaging process is begun. In order to enable this, one need only calculate the destination for each field of view before beginning imaging. In the flowchart in FIG. 5, the coordinate position of $(x_{(j)}', y_{(j)}')$ is the field of view destination, and a field of view movement is performed by converting this into stage coordinate system (X, Y).

It is noted that, in S114 in FIG. 4, when d exceeds the computed value, it is determined that the field of view position in question is appropriate, and a process of computing the next field of view position is performed. By adopting such a configuration, it becomes possible to define field of view positions without causing the intervals between fields of view to become excessively narrow. In addition, instead of such a method of adjusting field of view positions, it is also possible to apply other field of view position adjustment methods. By way of example, one option might be to define, with respect to the area of the overlapping region (or the lengths of the overlapping region in the X direction and the Y direction), an upper limit value and a lower limit value in advance, and adjust the field of view position so that the area of the overlapping region would fall within this range. With respect to this adjustment, by way of example, one option might be to carry out the adjustment of the field of view position by gradually moving the field of view along the outline, and stopping that movement once the area of the above-mentioned overlapping area has fallen between the above-mentioned upper and lower limit values.

As compared to a case where fields of view are simply assigned in a matrix-like fashion, in so far as it is necessary to assign fields of view along a curved outline, the area of the overlapping region varies in accordance with the state of the curve and so forth. The above-described method is thus extremely effective.

It is noted that in the example described above, there has been described an example in which a plurality of desired points along an outline of an object being observed are selected, and stage coordinates are determined based on the selection of the plurality of points. However, it is also possible to automatically determine stage coordinates, etc., based on the definition of the outline of the object being observed. One such example is described below.

Figure 14:
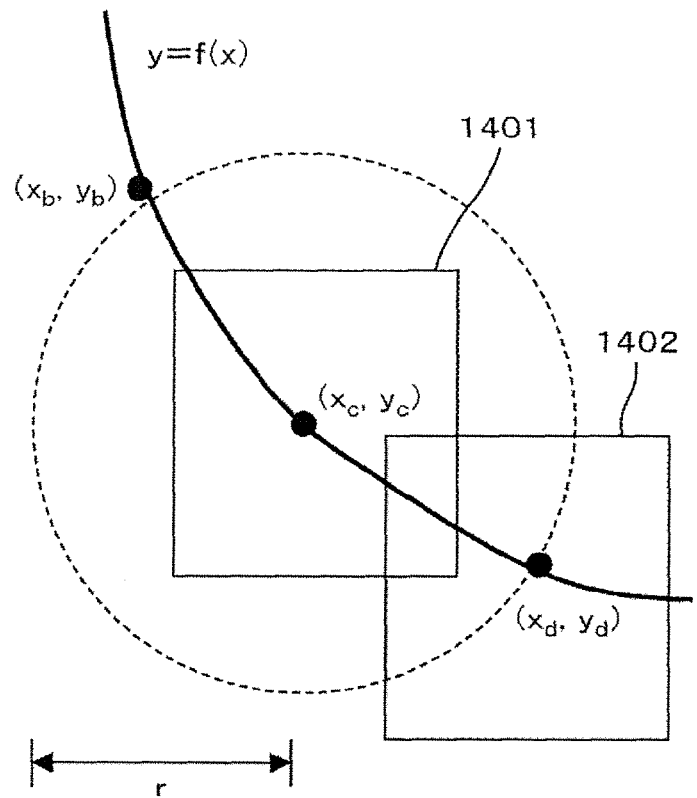
FIG. 14 is a diagram illustrating the principles of one method for automatically determining consecutive field of view positions.

FIG. 14 is a diagram illustrating another example of an algorithm for automatically determining FOV positions. In the present example, there is described an example in which a location that is set apart from one field of view (FOV) by an amount corresponding to distance r is defined as the next FOV.

In order to compute the position of a second FOV 1402 that follows a first FOV 1401, computations employing Equations (7) and (8) are carried out using an approximate equation that approximates an outline of an object being observed and central coordinates $(x_c, y_c)$ of the first FOV 1401.

[Equation 7]

$$(x_d - x_c)^2 + (y_d - y_c)^2 = r^2 \quad (7)$$

[Equation 8]

$$y = f(x) \quad (8)$$

Equation (7) is an approximate equation that is obtained by approximating an outline of the object being observed. r is a value related to the distance from the central coordinates of the first FOV. In order to compute the position of the central coordinates of the second FOV, in the present example, Equation (8) is substituted into Equation (7) to find the point of intersection between the circumference with radius r and the line representing y=f(x), and stage coordinates, etc., are so defined that this point of intersection would be the center of the second FOV.

By consecutively executing such a process along an outline of the object being observed, it becomes possible to automatically determine stage coordinates, etc., for acquiring FOVs of the entire outline. In order to form overlapping regions between FOVs, distance r is preferably so defined as to be less than the length of the sides of the FOV. Specifically, it is preferably defined as follows: (the size of the sides of the FOV—the desired size of the overlapping region). It is noted that the size of the overlapping region should preferably be freely definable in accordance with the purpose of observation, the observation conditions, etc.

According to the present example, even if the object being observed were to contain many curves, etc., in its outline, as in microorganisms, and it were thus difficult to determine field of view positions with respect thereto, it becomes possible to acquire consecutive field of view images based on field of view definitions at appropriate positions, and on appropriate overlapping region definitions between fields of view.

It is noted that while the overlapping parts are provided to perform the connection between field of view images in an appropriate manner, when they are defined to be excessively large, the number of acquired field of view images increases, which could potentially prolong observation time. In view of the above, there is described below a method of defining that results in the overlapping parts being of an appropriate size while securing at least a certain size for the overlapping regions.

Figure 15:
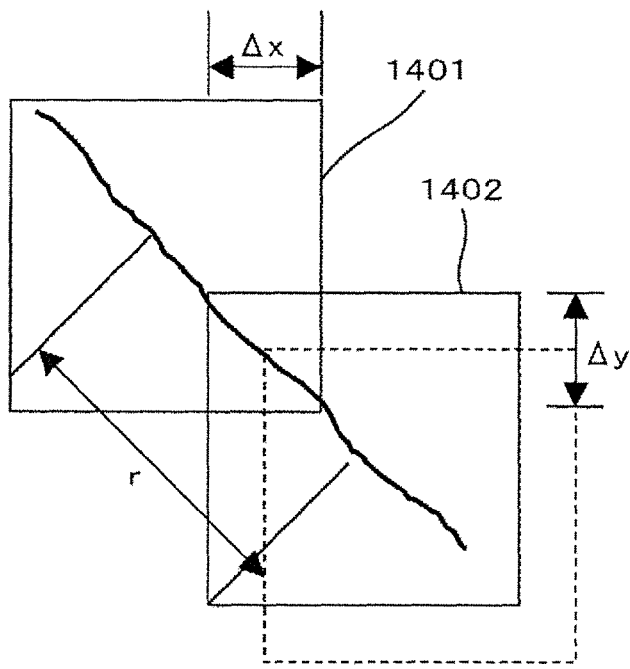
FIG. 15 is a diagram illustrating one example of a method of adjusting the size of an overlapping region between fields of view.

In cases where, as described above, consecutive fields of view are so defined that the distance between the centers of FOVs would be r, when the situation is such that the corners of FOVs are connected diagonally as in FIG. 15, the length of the outline within the overlapping region becomes longer as compared to when that is not the case. In view of such circumstances, one example of a method of making the size of the overlapping regions appropriate is described below.

Since the overlapping distance becomes longer at corner parts, computations are retried in accordance with the type of the equation or with how square the overlapping region is (cases in which the aspect ratio, the number of pixels in the X-direction, or the number of pixels in the Y-direction are of values that form a shape resembling a square), and the overlapping part is adjusted. More specifically, the distance between the FOVs is increased so that the area of the overlapping part would become smaller. By way of example, in the case of Figure xx, one option might be to adjust the distance between the FOVs in accordance with the ratio of $\Delta x$ to $\Delta y$. By way of example, considering a case where the distance between the FOVs is adjusted so as to make the lengths of outlines within overlapping regions uniform, while also making the lengths thereof be equal to distance D which is the same as when the FOVs are linearly arranged in the horizontal direction or in the vertical direction, one option might be to adjust the distance between the FOVs by moving an FOV by length D1−D of the outline. In so doing, the adjustment above may be performed when the length of an outline within an overlapping part exceeds a predetermined value, or adjustment may be performed in such a manner that the lengths of outlines within overlapping regions would always be a predetermined value.

In addition, with respect to cases in which a biological sample is observed, too, there sometimes are parts for which focused observation is desired. In such cases, it may be left possible to select any given part(s) of the biological sample, while allowing automatic selection for the remaining parts. More specifically, one option might be to assign, once desired parts have been selected, FOV positions at regular intervals as if to interpolate between those selected parts. In such cases, it would be favorable to find the interpolation distance while at the same time determining the value of r mentioned above in accordance with the size of the FOV determined based on the desired magnification for observation.

In addition, FOVs may be assigned using differing values of r depending on the part of the outline of the sample (or on the kind of the approximate curve approximating the outline).

It is noted that, by way of example, the relationship with the observation magnification of the electron microscope, coordinate information of pixels with respect to the image, and the field of view movement amount caused by the stage and/or the deflector when predetermined signals are supplied is pre-registered on a storage medium built into a controlling unit, and the movement of the field of view position with respect to the calculated position is performed by controlling the stage and/or the deflector based on the information registered on this storage medium.

Figure 6:
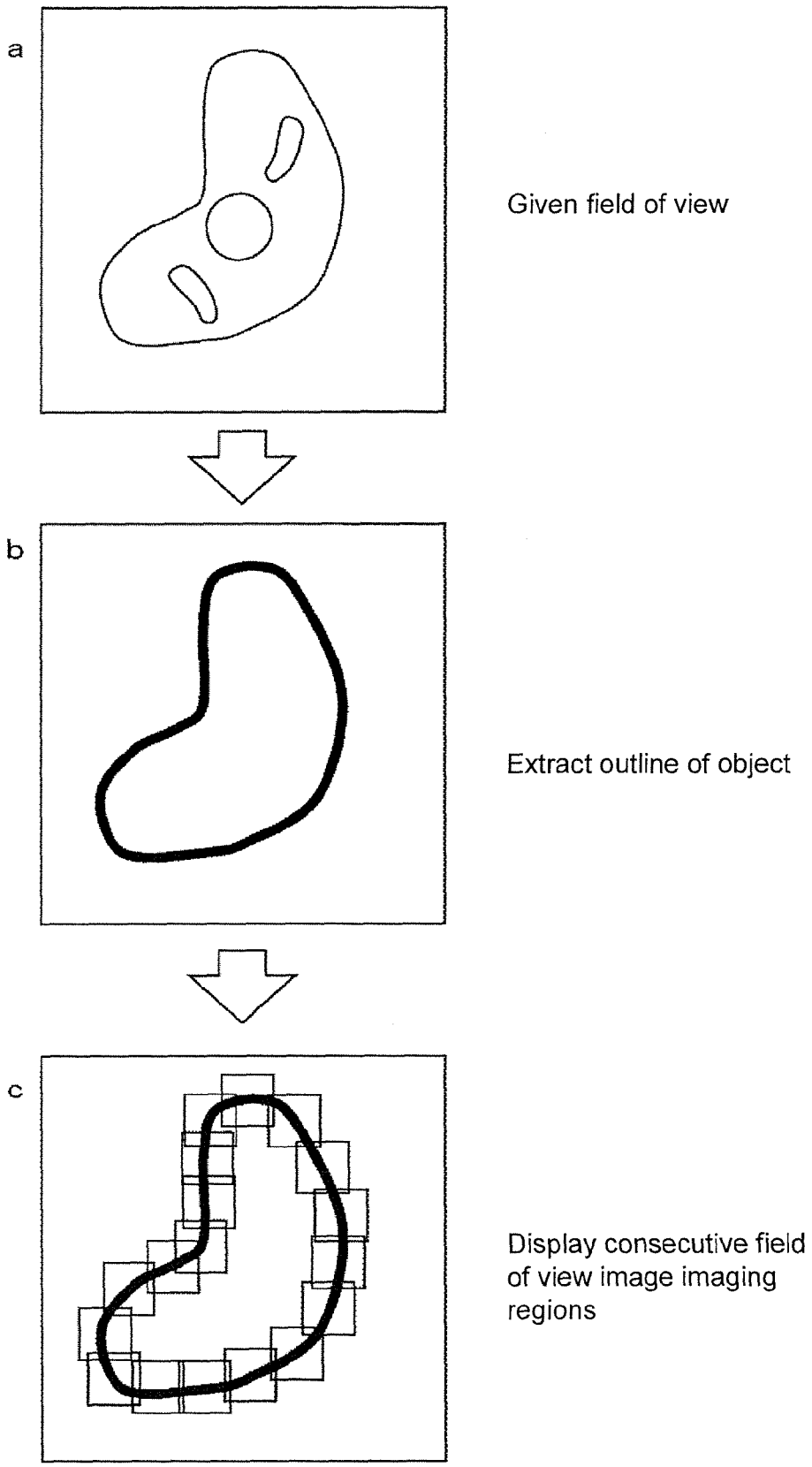
FIG. 6 is a diagram illustrating a method of defining consecutive field of view imaging regions by extracting a boundary of an object to be observed.
Figure 7:
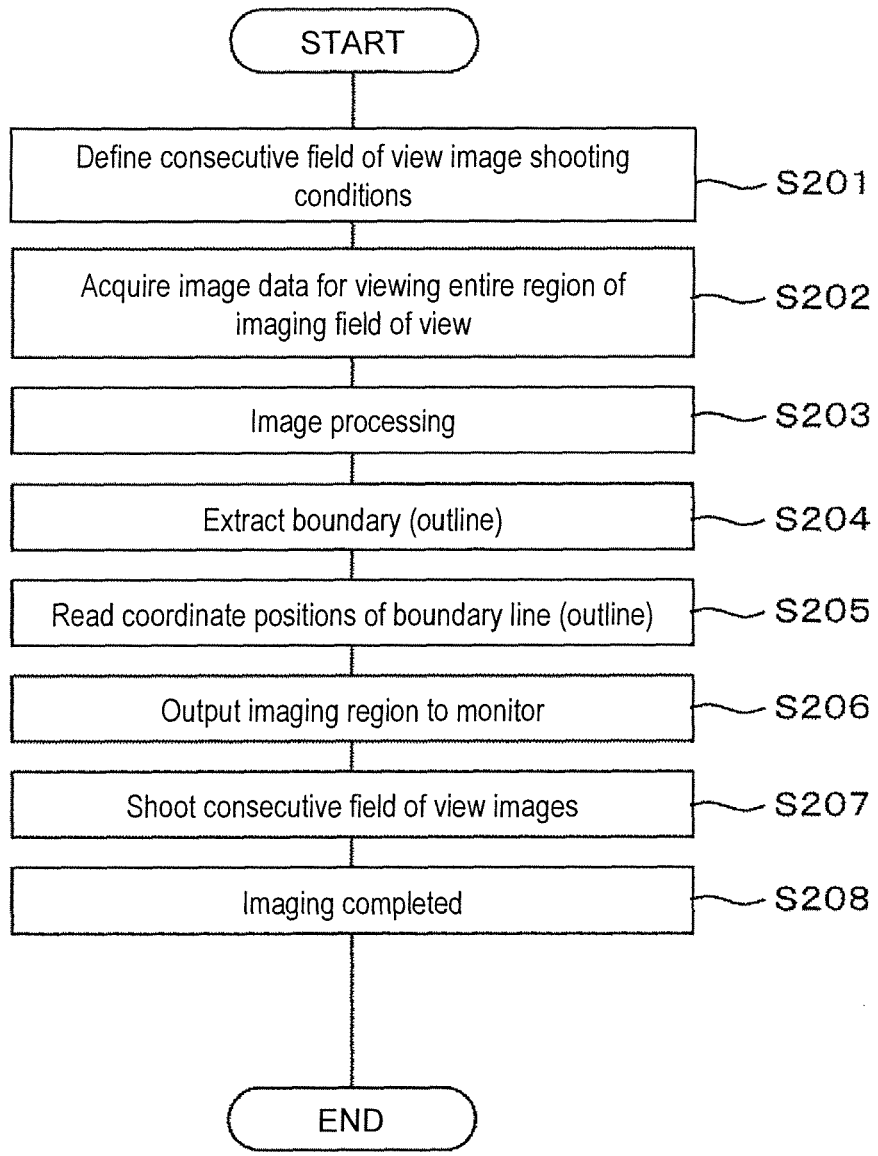
FIG. 7 is a flowchart illustrating a method of performing consecutive field of view imaging by extracting a boundary of an object to be observed.

A method will now be described with reference to the flowchart in FIG. 7 wherein, as shown in FIG. 6, an image of a given object to be observed is imaged at any desired magnification M at which the entire region of interest may be viewed, an outline of the object to be observed is extracted through image processing, such as by thresholding the image, and so forth, and imaging is performed through stage control or by controlling the electron beam deflector so that regions along the outline only or within the outline would be consecutive fields of view at a predetermined magnification and overlap amount.

In the present embodiment, by way of example, it is assumed that a given field of view is obtained as in FIG. 6a, wherein the entire region of interest can be viewed on the monitor 14. Image processing is performed to extract a boundary (outline), which results in a form such as that in FIG. 6b. Consecutive field of view imaging regions such as those shown in FIG. 6c are displayed, and consecutive field of view images of only the boundary of the object being observed or of the entire region are imaged.

First, in step 201, conditions for imaging consecutive field of view images are defined. The operator inputs any desired imaging magnification M' for the consecutive field of view images and overlap amount $\Delta N$ pixels for the field of view. The operations here are performed using the input device 10, such as a keyboard and a mouse, etc. Next, in step 202, while looking at the image of the sample 3 displayed on the monitor 14, magnification M of any desired value with which the entire region of interest can be viewed is defined, and the sample stage drive part 7 is moved in such a manner that desired parts would fall within the imaging range. In so doing, in synchrony with the sample stage drive part 7, the coordinate position of the sample stage drive part 7 is read by the position detector 8 connected to the sample stage drive part 7 and is transmitted to the PC 11 via the interface 9b. An image of any desired object is acquired using the imaging apparatus 6 and stored in the memory 12 via the interface 9c. In step 203, the processing unit 13 reads from the memory 12 the image data acquired in step 202, and performs such image processing as sharpness and edge enhancement, contrast adjustment, threshold processing, etc. In step 204, a boundary (outline) is extracted. In step 205, coordinate positions of the boundary (outline) extracted in step 204 are defined as $(x_1, y_1)$, $(x_2, y_2)$, $(x_3, y_3) \ldots, (x_m, y_m)$ (where x, y are integers) and stored in the memory 12. In step 206, based on imaging magnification M' and overlap amount $\Delta N$ pixels for the field of view that were inputted in step 201 and the coordinates read in step 205, the processing unit 13 calculates imaging regions for consecutive field of view images and outputs them on the monitor 14 so that the imaging range for consecutive field of view images can be viewed on the monitor 14. They may also be displayed superimposed on an image in which the entire region of interest can be viewed. In step 207, consecutive field of view images are imaged. Consecutive field of view images are imaged through a method similar to that of the flowchart in FIG. 5 described above. In step 208, the imaging of consecutive field of view images is terminated. In addition, as an alternative to the above-mentioned method of imaging consecutive field of view images through stage control, imaging is also possible through a method in which an electron beam deflector is controlled.

Figure 8:
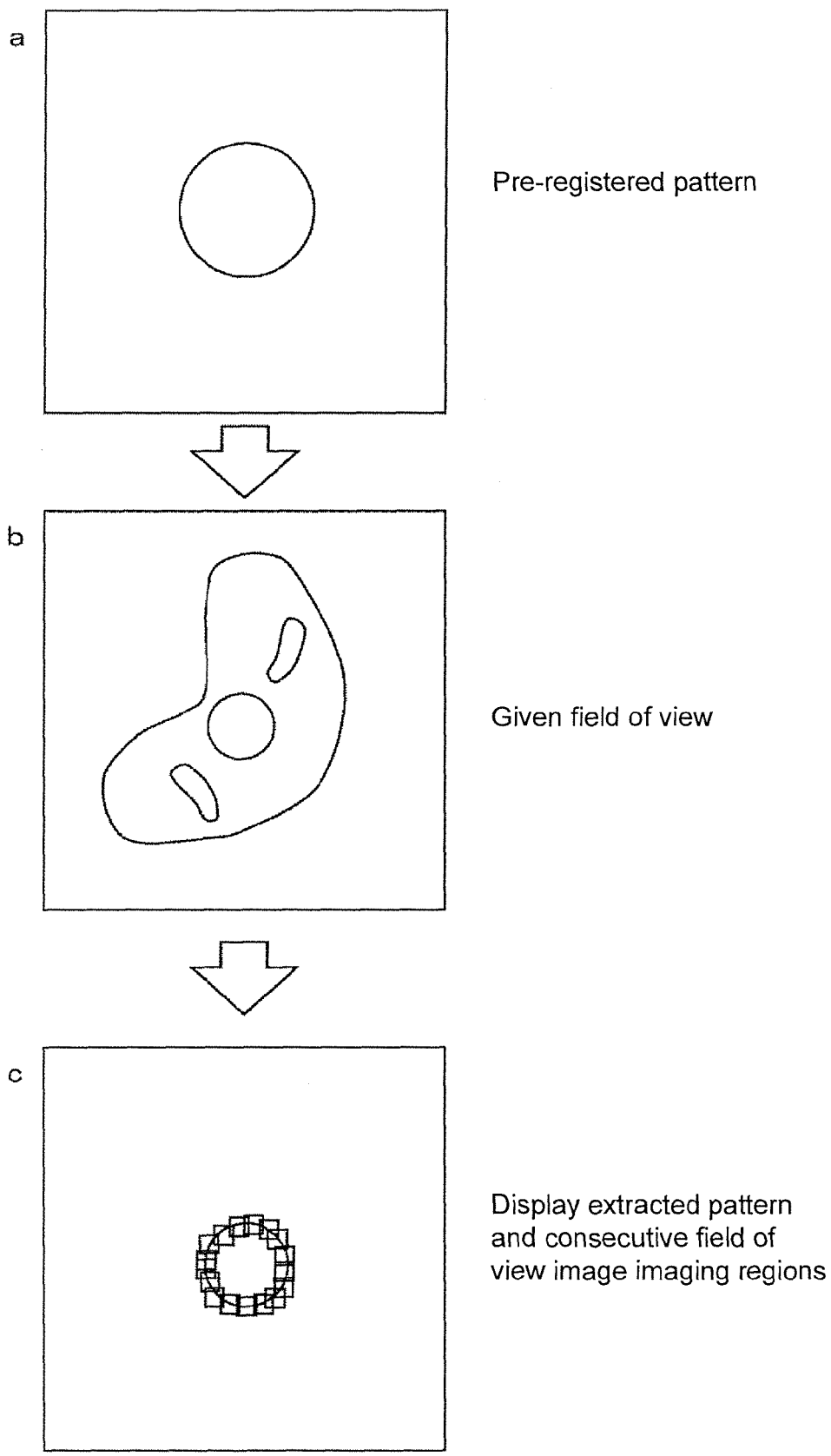
FIG. 8 is a diagram illustrating a method of defining consecutive field of view imaging regions by extracting a boundary of an object to be observed that matches a pre-registered pattern.
Figure 9:
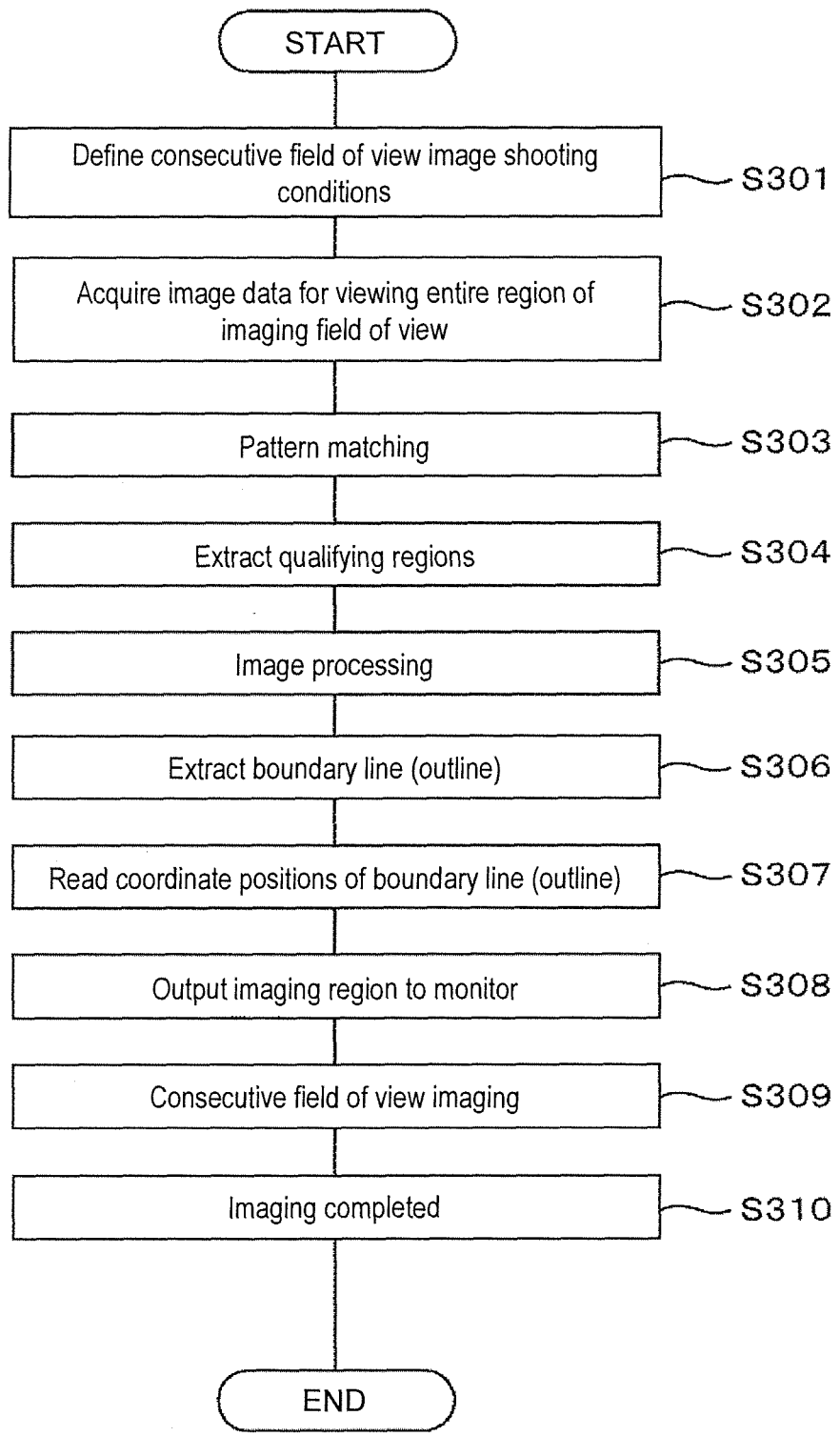
FIG. 9 is a flowchart illustrating a method of performing consecutive field of view aging by extracting a boundary of an object to be observed that matches a pre-registered pattern.

As shown in FIG. 8, an image of any desired object is imaged at magnification M of any desired value with which the entire region of interest can be viewed, a region matching a pre-registered pattern is extracted, and imaging regions for consecutive field of view images are determined. A method will now be described with reference to the flowchart in FIG. 9, wherein imaging is performed through automatic stage control or by controlling the electron beam deflector in such a manner that only the boundary of the region or the entire region would be consecutive field of view images at a predetermined magnification and overlap amount.

In the present embodiment, by way of example, the circle shown in FIG. 8a is registered as a pattern, and assuming that a given imaged field of view is obtained on the monitor 14 as in FIG. 8b, a form having the same pattern as the circle that has been selected as a pattern is automatically extracted. Thereafter, as shown in FIG. 8c, consecutive field of view imaging regions are outputted, and consecutive field of view images are imaged for the boundary of the form only or for the entire region.

First, in step 301, conditions for imaging consecutive field of view images are defined. The operator inputs any desired imaging magnification M' for the consecutive field of view images and overlap amount $\Delta N$ pixels for the field of view, and registers any desired pattern for imaging consecutive field of view images. The operations here are performed using the input device 10, such as a keyboard and a mouse, etc. The pattern may be defined based on such conditions as, by way of example, the angle formed by the sides, ellipticity, the length ratio of the long axis to the short axis, etc. Alternatively, it may be defined by calling a shape pre-stored in the memory 12. In step 302, while looking at the image of the sample 3 displayed on the monitor 14, magnification M of any desired value with which the entire region of interest can be viewed is defined, and the sample stage drive part 7 is moved in such a manner that desired parts would fall within the imaging range. In so doing, in synchrony with the sample stage drive part 7, the coordinate position of the sample stage drive part 7 is read by the position detector 8 connected to the sample stage drive part 7 and is transmitted to the PC 11 via the interface 9b. An image of the desired part is acquired using the imaging apparatus 6 and stored in the memory 12 via the interface 9c. In step 303, the processing unit 13 performs pattern matching between the image data imaged in step 302 and the shape pre-registered in step 301. In step 304, a form that has been determined, through pattern matching, as being identical to the pre-registered shape is extracted. In step 305, the processing unit 13 performs such image processing as sharpness and edge enhancement, contrast adjustment, threshold processing, etc., on the region extracted in step 304. In step 306, a boundary (outline) within a relevant region is extracted. In step 307, coordinate positions of the boundary (outline) extracted in step 306 are defined as $(x_1, y_1)$, $(x_2, y_2)$, $(x_3, y_3) \ldots, (x_m, y_m)$ (where x, y are integers) and stored in the memory 12. In step 308, based on imaging magnification M' and overlap amount ΔN pixels for the field of view that were inputted in step 301 and the coordinates read in step 306, the processing unit 13 calculates imaging regions for consecutive field of view images and outputs them on the monitor 14 so that the imaging range for consecutive field of view images can be viewed on the monitor 14. In step 309, consecutive field of view images are imaged. Consecutive field of view images are imaged through a method similar to that of the flowchart in FIG. 5 described above. In step 310, the imaging of consecutive field of view images is terminated. In addition, as an alternative to the above-mentioned method of imaging consecutive field of view images through stage control, imaging is also possible through a method in which an electron beam deflector is controlled.

Figure 10:
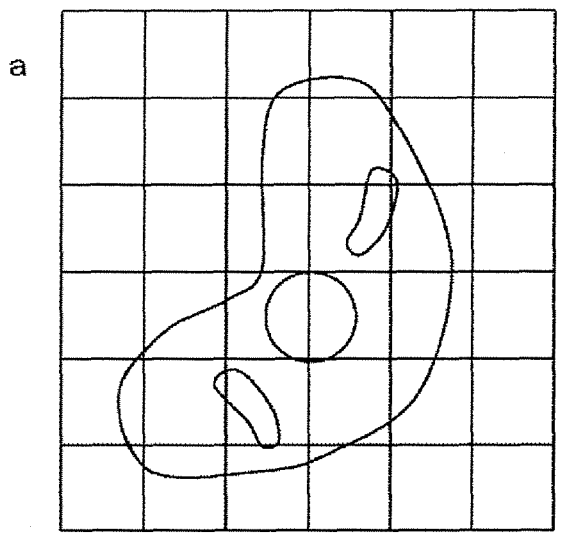
FIG. 10 is a diagram illustrating a method of performing consecutive field of view imaging by specifying desired imaging regions from among consecutive field of view imaging regions displayed in a grid.
Figure 10:
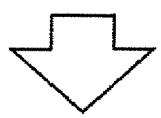
Figure 10:
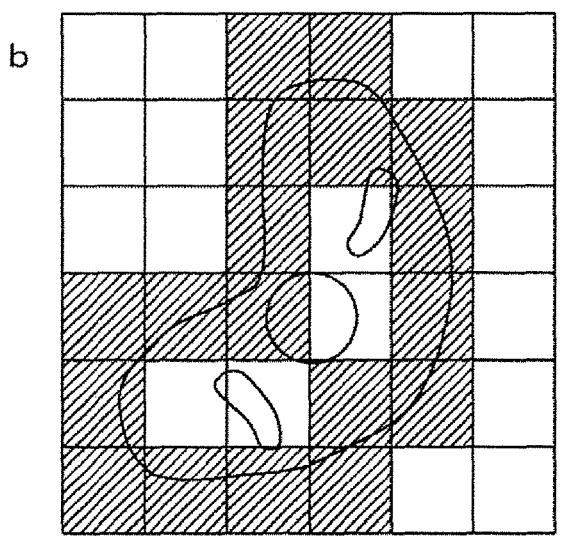
Figure 11:
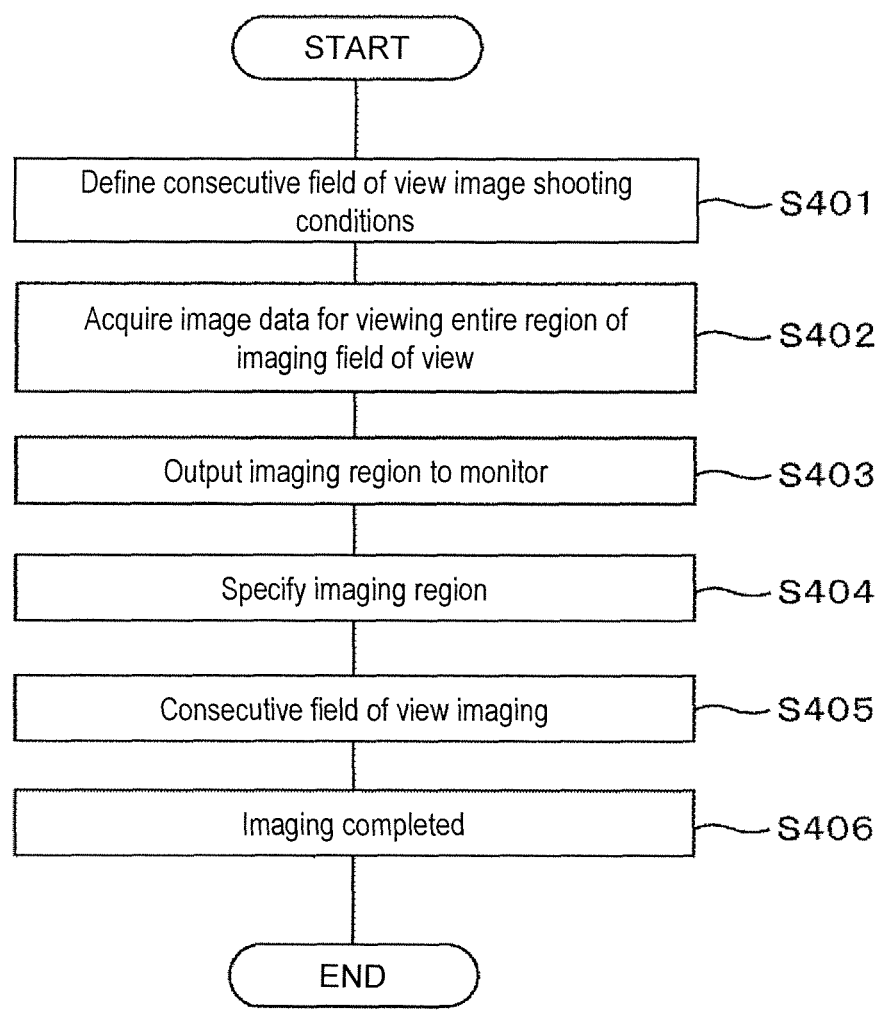
FIG. 11 is a flowchart illustrating a method of performing consecutive field of view imaging by specifying desired imaging regions from among consecutive field of view imaging regions displayed in a grid.

As shown in FIG. 10, an image of any desired object is displayed on the monitor at magnification M of any desired value at which it is possible to view the entire field of view for performing consecutive field of view imaging, and imaging regions calculated based on a predetermined magnification and overlap amount are displayed in a grid on the monitor. A method will now be described with reference to the flowchart in FIG. 11, wherein any desired imaging region is specified with a cursor or a mouse, and the specified region is imaged through stage control or by controlling the electron beam deflector so as to obtain consecutive fields of view at a predetermined magnification and overlap amount.

First, in step 401, conditions for imaging consecutive field of view images are defined. The operator inputs any desired imaging magnification M' for the consecutive field of view images and overlap amount ΔN pixels for the field of view. The operations here are performed using the input device 10, such as a keyboard and a mouse, etc. Next, in step 402, while looking at the image of the sample 3 displayed on the monitor 14, magnification M of any desired value with which the entire region of interest can be viewed is defined, and the sample stage drive part 7 is moved in such a manner that desired parts would fall within the imaging range. In so doing, in synchrony with the sample stage drive part 7, the coordinate position of the sample stage drive part 7 is read by the position detector 8 connected to the sample stage drive part 7 and is transmitted to the PC 11 via the interface 9b. An image of the desired part is acquired using the imaging apparatus 6 and stored in the memory 12 via the interface 9c. In step 403, based on imaging magnification M' and overlap amount ΔN pixels for the field of view that were inputted in step 401, consecutive field of view image imaging regions are calculated at the processing unit 13 and displayed on the monitor 14 so that the consecutive field of view image imaging regions may be viewed on the monitor 14. As shown in FIG. 10a, imaging regions may be represented with grid lines, etc. In step 404, the desired imaging regions are specified with a cursor or a mouse. The operations here are performed using the input device 10, such as a keyboard and a mouse, etc. The specified regions are distinguished from the fields of view that have not been specified, and are displayed accordingly on the monitor 14. By way of example, as in FIG. 10b, the specified regions are displayed with their color, etc., changed. In step 405, the regions specified in step 404 are imaged through automatic stage control or by controlling an electron beam deflector so as to obtain consecutive fields of view at the predetermined magnification and overlap amount inputted in step 401.

In the embodiments above, if sample damage due to the incident electron beam, sample or stage drift, or stage vibration are to be taken into consideration, the control configuration would be as follows. In the process of imaging consecutive fields of view, there is a need to move the field of view to be imaged to the next field of view each time imaging is performed. As such, there is adopted a configuration comprising a means which, in order to reduce the electron beam incident on the sample during the above-mentioned moving of the field of view, makes electron beam incidence controllable such that it is incident only during imaging by controlling the bias voltage for the electron gun so as to block the electron beam or through deflection control of the electron beam by the electron beam deflector so as to prevent it from being incident on the sample. Next, at the time of completion of moving to the field of view position to be imaged, in order to suppress sample drift, it comprises a control means that starts irradiation from a low electron beam intensity, and gradually sets it to a predetermined electron beam intensity for imaging. It is noted that, with respect to a means for field of view movement, too, in order suppress sample drift or vibration due to stage movement, it is made possible to move based on one or a combination of stage driven and electromagnetic field of view movement depending on the imaging magnification and movement amount. Further, the configuration is such that it comprises, so as to reduce the effects of sample drift and stage vibration, a means that sets a waiting time for starting imaging after field of view movement, and a means that delays starting imaging by the aforementioned time.

Further, with respect to the embodiments described above, sequences for imaging consecutive fields of view have been described with the imaging magnification and imaging conditions (camera sensitivity, threshold, focus, etc.) assumed constant. However, by doing so with these combinations made pre-definable, it is possible to acquire various image data more efficiently. Specifically, there is adopted a configuration which comprises an input means and magnification varying means that make it possible to define a plurality of imaging magnifications when it is desired that consecutive fields of view be observed/recorded at higher resolutions.

With such a configuration, it is possible to obtain consecutive field of view images of varying imaging magnifications when the sequence is made to be such that field of view movements are performed based on the maximum imaging magnification, it is determined, depending on the field of view position, whether or not it is necessary to perform imaging at a defined magnification, and imaging is repeated when it is determined to be necessary. Similarly, by adopting a configuration comprising a means that makes it possible to define a plurality of imaging conditions and a means for controlling those conditions, and by performing control in such a manner that, while such an imaging sequence as that described above is performed, imaging is performed under a plurality of conditions by varying the conditions each time imaging is performed for each field of view, it becomes possible to obtain consecutive field of view images of varying image quality. Next, although descriptions have been provided above taking as examples cases in which there is one region for performing consecutive imaging, by using the method above, it would be readily possible, by making it possible to define a plurality of field of view regions, to perform control in such a manner as to repeat completing the imaging of a series of consecutive field of view regions, performing a field of view movement to the next defined field of view region, and imaging a series of consecutive fields of view.

Figure 12:
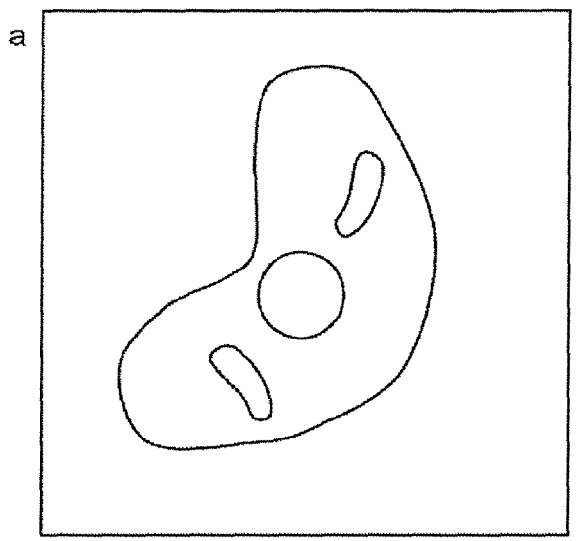
FIG. 12 is a diagram illustrating a method of efficiently organizing image data imaged at each field of view region.
Figure 12:
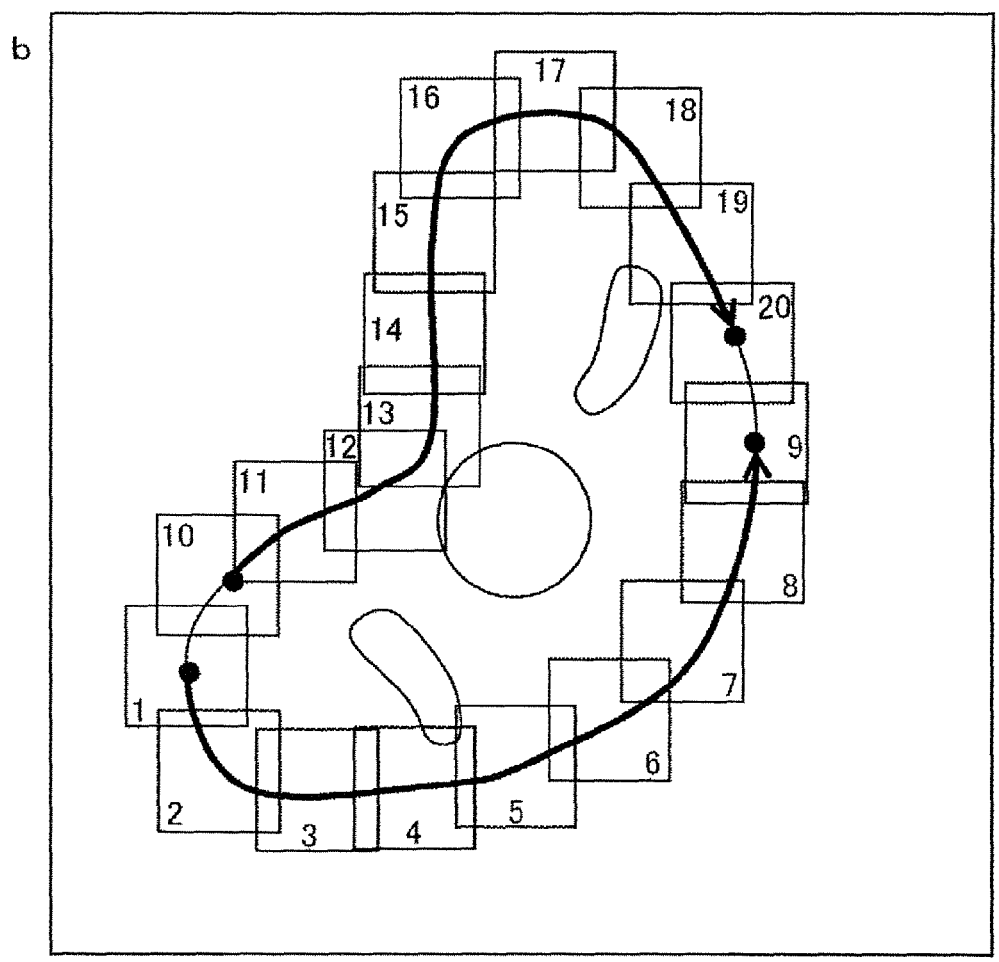

There will now be provided a description with reference to FIG. 12 regarding efficiently organizing imaged image data for each field of view region. Imaging is first performed at a magnification at which all field of view regions to be imaged can be viewed, and this is imported as image data (FIG. 12a). Sequence numbers (or symbols) from when the fields of view are imaged at a predetermined magnification are stored as part of the imaged image data or file names of the respective fields of view. By adopting a configuration comprising a function for creating image data (FIG. 12b) in which frames representing the imaging regions for the respective fields of view and the above-mentioned sequence numbers within those frames are superimposed on the image data in FIG. 12a, and for displaying it on the monitor, and a means for storing the image data, efficiency improves in viewing the images for the respective fields of view again or in re-combining them as consecutive fields of view.

Figure 13:
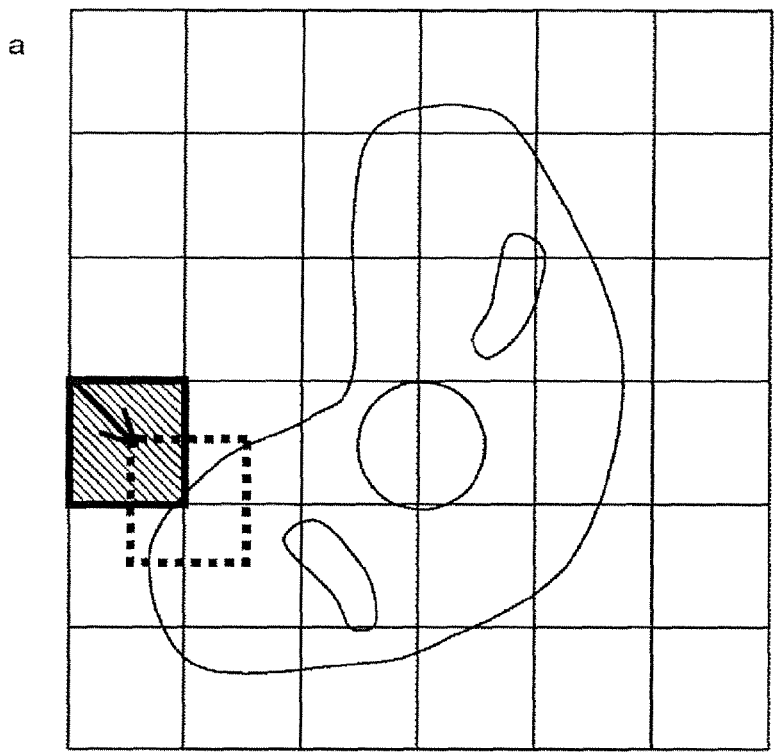
FIG. 13 is a diagram illustrating a function of redefining an automatically calculated imaging field of view position.
Figure 13:
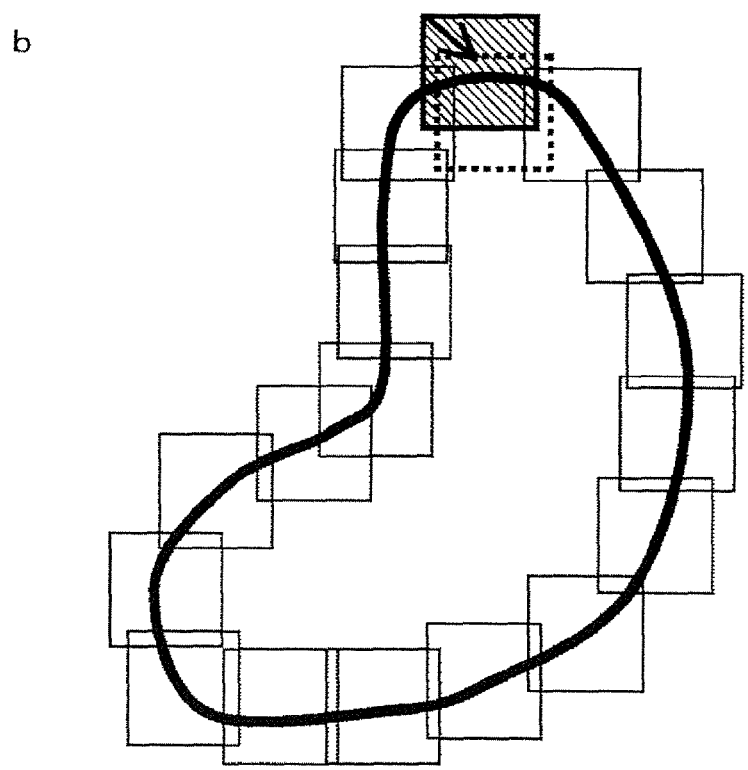

With respect to the embodiments described above, there have been provided descriptions wherein field of view movements and imaging are performed by automatically calculating the coordinates for field of view movement destinations that become the centers of the respective field of view regions to be imaged. However, by displaying an image with which each of the field of view regions to be imaged and the entire field of view region of interest can be viewed, it is possible to view, prior to imaging, images of the respective fields of view, the overlap amount, etc. However, if the imaging position for each field of view is to be automatically determined, when, as in FIG. 10, imaging regions are displayed in a grid, the light-colored region shown in FIG. 13a would only marginally cover the object of interest within the imaging field of view. This may be prevented by providing a means, like a mouse, for selecting display regions of the respective field of view regions to be imaged, and by controlling field of view movements and imaging by moving the selected field of view region on the monitor along with the movement of the mouse, and re-calculating the imaging field of view position in accordance with the distance and direction after movement. A function that thus allows redefinition with automatically calculated imaging field of view positions is readily applicable, as shown in FIG. 13b, to the cases in FIG. 2, FIG. 3, FIG. 6, and FIG. 8 as well.

LIST OF REFERENCE NUMERALS

1 Electron gun
2a, 2b Irradiation lens
3 Sample
4a-4e Image forming lens system
5 Fluorescent plate
6 Imaging apparatus
7 Sample holding and stage drive part
8 Stage position detector
9a-9d Interface
10 Input device
11 PC
12 Memory
13 Processing unit
14 Monitor

The invention claimed is:

1. A sample observation method in which a region is defined from a first image obtained with an electron microscope, an image of greater magnification than the first image being acquired in the region, and in which a sample is observed using a second image obtained based on the defined region, the sample observation method comprising:
a step of specifying, in the first image, an outline, or a plurality or points located along the outline, with respect to an object of observation; and
a step of arranging, along the outline, a plurality of fields of view for acquiring the second image in such a manner that there is an overlap between parts of the plurality of fields of view, wherein:
movement between the plurality of fields of view is performed using a sample stage or a deflector that deflects an electron beam,
a distance between the fields of view is adjusted in accordance with an overlap amount between the fields of view, and
adjustment of the distance between the fields of view is performed when distance d between the fields of view is equal to or less than $(N-\Delta N)/(M'/M)$, where
N: number of imaged pixels,
$\Delta N$: overlap amount of field of view,
M': magnification of second image, and
M: magnification of first image.

2. The sample observation method according to claim 1, wherein a movement amount for the sample stage, or a deflection signal for the deflector, for acquiring the plurality of fields of view is obtained based on an interpolation computation between the specified plurality of points.

3. The sample observation method according to claim 1, wherein adjustment of the distance between the fields of view is performed when distance d between the fields of view is equal to or less than $(N-\Delta N)/(M'/M)$, and in such a manner as to increase the distance between the fields of view.

4. The sample observation method according to claim 1, wherein it is determined whether or not the overlap amount between the fields of view falls within a predetermined range, and if it is determined to fall outside of the predetermined range, positions of the fields of view are adjusted so as to place the overlap amount within the predetermined range.

5. The sample observation method according to claim 1, wherein the outline is formed by performing curve interpolation between the plurality of points.

6. An electron microscope comprising:
an electron source that emits an electron beam to irradiate a sample; and a control unit that controls a sample stage, on which the sample is disposed, or a deflector, which deflects the electron beam, wherein:

the control unit comprises a processor and a storage medium storing parameters for controlling the sample stage and the deflector, and the control unit is configured to:

determine, based on an outline, or on a plurality of specified points located along the outline, with respect to a first image acquired by the electron microscope, positions of a plurality of fields of view for acquiring a second image of a higher magnification than the first image along the outline in such a manner that there is an overlap between parts of the plurality of fields of view;

perform movement between the plurality of fields of view using the sample stage or the deflector based on the parameters stored in the storage medium;

adjust a distance between the fields of view in accordance with an overlap amount between the fields of view; and adjust the distance between the fields of view when distance d between the fields of view is equal to or less than $(N-\Delta N)/(M'/M)$, where N: number of imaged pixels, $\Delta N$: overlap amount of field of view, M': magnification of second image, and M: magnification of first image.

7. The electron microscope according to claim 6, wherein the control unit controls the sample stage or the deflector in such a manner that the fields of view for acquiring the second image would be consecutive fields of view of a predetermined magnification and a pre-defined overlap amount.

8. The electron microscope according to claim 6, wherein each imaging field of view region is displayed simultaneously with the display image in a superimposed manner.

9. The electron microscope according to claim 6, wherein a field of view region for which imaging has been completed is displayed with its image tone and/or color varied, or is displayed in a blinking manner, so as to enable distinction from a display of the each imaging field of view region.

10. The electron microscope according to claim 6, wherein an image in which the entire region of interest can be viewed and each field of view region to be imaged are displayed in a superimposed manner on a monitor, and the images displayed in a superimposed manner are stored, called, and displayed as image data.

11. The electron microscope according to claim 6, wherein, in storing image data of each field of view region to be imaged, a number or symbol representing an imaging order is stored as part of the image data or as part of an image data name, while the imaging order is displayed near a display of each field of view region to be imaged.

12. The electron microscope according to claim 6, further comprising:

means that selects a display region of each field of view region to be imaged; and means that moves a selected field of view region, wherein control is performed in such a manner that an imaging position of the selected field of view region is moved in conjunction with the means.

13. The electron microscope according to claim 6, wherein the control unit adjusts the distance between the fields of view when distance d between the fields of view is equal to or less than $(N-\Delta N)/(M'/M)$, and in such a manner as to increase the distance between the fields of view.

* * * * *